United States Patent
Wu et al.

(10) Patent No.: US 8,922,328 B2
(45) Date of Patent: Dec. 30, 2014

(54) ELECTRICAL FUSE STRUCTURE

(75) Inventors: Kuei-Sheng Wu, Tainan (TW);
Ching-Hsiang Tseng, Tainan (TW);
Chang-Chien Wong, Tainan (TW)

(73) Assignee: United Microelectronics Corp.,
Science-Based Industrial Park, Hsin-Chu
(TW)

( * ) Notice: Subject to any disclaimer, the term of this patent is extended or adjusted under 35 U.S.C. 154(b) by 330 days.

(21) Appl. No.: 13/210,386

(22) Filed: Aug. 16, 2011

(65) Prior Publication Data

US 2013/0043972 A1 Feb. 21, 2013

(51) Int. Cl.
*H01H 85/046* (2006.01)
*H01L 23/525* (2006.01)
*H05K 1/02* (2006.01)
*H05K 1/11* (2006.01)

(52) U.S. Cl.
CPC .......... *H01L 23/5256* (2013.01); *H05K 1/0293* (2013.01); *H01H 85/046* (2013.01); *H05K 1/115* (2013.01)
USPC ............................ 337/159; 337/187; 257/529

(58) Field of Classification Search
USPC .......... 337/159, 187, 297; 365/225.7; 257/50, 257/209, 529, 530, E21.592, E23.149, 257/E23.147; 29/623
See application file for complete search history.

(56) References Cited

U.S. PATENT DOCUMENTS

| | | | | |
|---|---|---|---|---|
| 4,382,289 A * | 5/1983 | Saitoh | | 365/96 |
| 4,670,970 A * | 6/1987 | Bajor | | 438/467 |
| 4,747,076 A * | 5/1988 | Mukai | | 365/96 |
| 5,019,532 A * | 5/1991 | Kaya | | 438/449 |
| 5,420,456 A * | 5/1995 | Galbi et al. | | 257/529 |
| 5,572,409 A * | 11/1996 | Nathan et al. | | 361/806 |
| 6,242,789 B1 * | 6/2001 | Weber et al. | | 257/529 |
| 6,512,284 B2 * | 1/2003 | Schulte et al. | | 257/530 |
| 6,960,978 B2 * | 11/2005 | Leigh et al. | | 337/159 |
| 7,460,003 B2 * | 12/2008 | Hsu et al. | | 337/159 |
| 7,545,253 B2 * | 6/2009 | Hsu et al. | | 337/159 |
| 7,635,907 B2 * | 12/2009 | Ueda | | 257/529 |
| 7,728,407 B2 * | 6/2010 | Ueda | | 257/529 |
| 7,906,848 B2 * | 3/2011 | Kumagai et al. | | 257/758 |
| 8,159,041 B2 * | 4/2012 | Saitou | | 257/529 |
| 2003/0209734 A1 * | 11/2003 | Kothandaraman | | 257/209 |
| 2004/0262710 A1 * | 12/2004 | Ueda | | 257/529 |
| 2005/0003199 A1 * | 1/2005 | Takaya et al. | | 428/413 |
| 2005/0167728 A1 * | 8/2005 | Kothandaraman et al. | ... | 257/314 |
| 2005/0219932 A1 * | 10/2005 | Diorio et al. | | 365/225.7 |
| 2005/0285222 A1 * | 12/2005 | Thei et al. | | 257/529 |

(Continued)

FOREIGN PATENT DOCUMENTS

JP   60231350 A * 11/1985   ............. H01L 27/04
JP   63246844 A * 10/1988   ............. H01L 21/82

OTHER PUBLICATIONS

H. Takaoka, "A Novel Via-fuse Technology Featuring Highly Stable Blow Operation with Large On-off Ratio for 32nm Node and Beyond", 2007.

*Primary Examiner* — Anatoly Vortman
(74) *Attorney, Agent, or Firm* — Winston Hsu; Scott Margo (57) ABSTRACT

An electrical fuse structure includes a top conductive pattern having a top fuse and a top fuse extension portion, a bottom conductive pattern having a bottom fuse and a bottom fuse extension portion corresponding to the top fuse extension portion, and a via conductive layer positioned between the top fuse extension portion and the bottom fuse extension portion for electrically connecting the top fuse extension portion and the bottom fuse extension portion.

21 Claims, 6 Drawing Sheets

(56) References Cited

U.S. PATENT DOCUMENTS

| | | | |
|---|---|---|---|
| 2007/0145515 A1* | 6/2007 | Chen et al. | 257/499 |
| 2007/0262414 A1* | 11/2007 | Ueda | 257/529 |
| 2007/0280012 A1* | 12/2007 | Obayashi et al. | 365/200 |
| 2008/0044660 A1* | 2/2008 | Takaya et al. | 428/413 |
| 2008/0217735 A1* | 9/2008 | Chen et al. | 257/529 |
| 2008/0258256 A1* | 10/2008 | Otsuka et al. | 257/529 |
| 2009/0085152 A1* | 4/2009 | Bernstein et al. | 257/529 |
| 2009/0206978 A1* | 8/2009 | Hwang et al. | 337/295 |
| 2009/0267723 A1* | 10/2009 | Hwang et al. | 337/290 |
| 2010/0090749 A1* | 4/2010 | Yang | 327/524 |
| 2010/0207239 A1* | 8/2010 | Saitou | 257/529 |
| 2011/0001552 A1* | 1/2011 | Shin et al. | 327/525 |
| 2011/0267136 A1* | 11/2011 | Ueda | 327/525 |
| 2012/0154102 A1* | 6/2012 | Chen | 337/290 |

\* cited by examiner

ELECTRICAL FUSE STRUCTURE

BACKGROUND OF THE INVENTION

1. Field of the Invention

The present invention relates to an electrical fuse (hereinafter abbreviated as e-fuse), and more particularly, to an e-fuse having a larger blowing window.

2. Description of the Prior Art

As semiconductor processes become more complex, semiconductor components are more susceptible to defects caused in the semiconductor processes. For example, the whole chip may be unusable once a single metal link, a diode, or a MOS is broken down. To solve the problems, there have been proposed fuses that can be selectively blown for increasing the yield of IC manufacturing.

In general, fuse circuits are electrically connected to redundant circuits of an IC. When defects are found in the circuit, fuses can be selectively blown for repairing or replacing the defective circuits. In addition, fuses provide the function of programming circuits for various customized functions.

On the other hand, fuses are classified into two categories based on their operation: thermal fuse having the open circuit condition provided by Laser zip and e-fuse having the open circuit condition provided by proper circuit generating electro-migration (EM) effect. The e-fuse for semiconductor devices may be classified into categories of poly e-fuse, MOS capacitor anti-fuse, diffusion fuse, contact e-fuse, contact anti-fuse, and the like.

SUMMARY OF THE INVENTION

According to an aspect of the present invention, an e-fuse structure is provided. The e-fuse structure includes a top conductive pattern having a top fuse and a top fuse extension portion, a bottom conductive pattern having a bottom fuse and a bottom fuse extension portion corresponding to the top fuse extension portion, and a via conductive layer positioned between the top fuse extension portion and the bottom fuse extension portion for electrically connecting the top fuse extension portion and the bottom fuse extension portion.

According to the e-fuse structure provided by the present invention, the top fuse extension portion and the bottom fuse extension portion are respectively extended from the top fuse and the bottom fuse. Consequently, the electro-migration effect is amplified by those extension portions and thus the blowing current used to provide open circuit condition to the e-fuse is reduced. In other words, the e-fuse structure provided by the present invention obtains a larger blowing window due to the top fuse extension portion and the bottom fuse extension portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
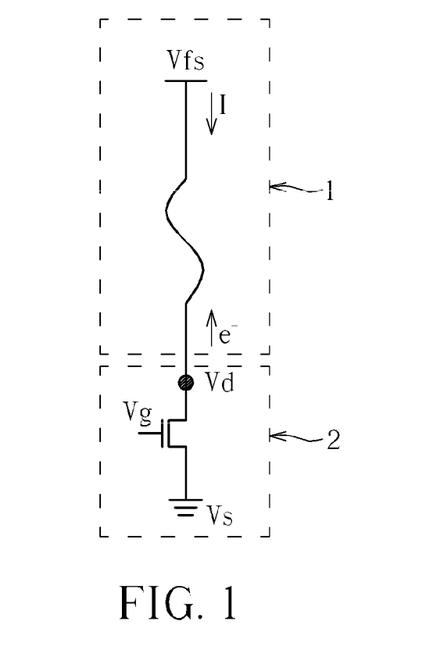
FIG. 1 illustrates a blowing mechanism of an e-fuse structure.

A blowing mechanism of an e-fuse structure is typically shown in FIG. 1. The cathode of an e-fuse structure 1 is electrically connected to the drain of a blowing device such as a transistor 2. A voltage Vfs is applied to the anode of the e-fuse structure 1, a voltage Vg is applied to the gate of the transistor 2, and a voltage Vd is applied to the drain of the transistor 2, respectively. The source of the transistor 2 is grounded. The electric current (I) is from the anode of the e-fuse structure 1 to the cathode of the e-fuse structure 1; and the electrons flow ($e^-$) is from the cathode of the e-fuse structure 1 to the anode of the e-fuse structure 1. The electric current suitable for the blowing is in a proper range. If the electric current is too low, the electron-migration effect is not completed, and if it is too high, the e-fuse structure 1 tends to be thermally ruptured. In general, the blowing current for an e-fuse structure made by a 32/28 nanometer (nm) manufacturing process is between 21.6 mA and 30 mA.

Figure 2:
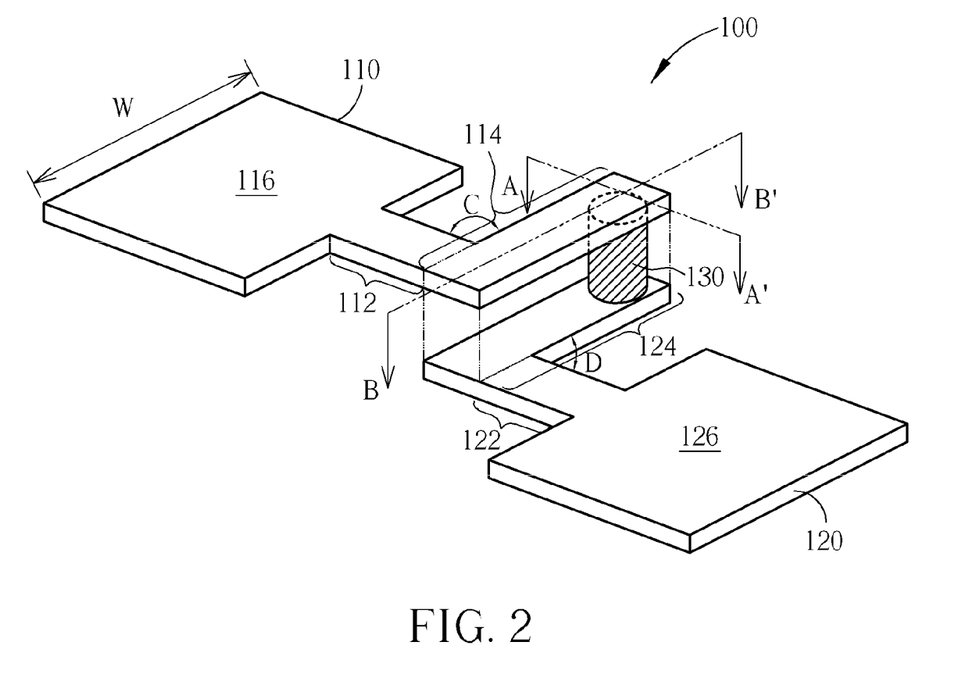
FIG. 2 is a schematic drawing illustrating an e-fuse structure provided by a first preferred embodiment of the present invention.
Figure 3:
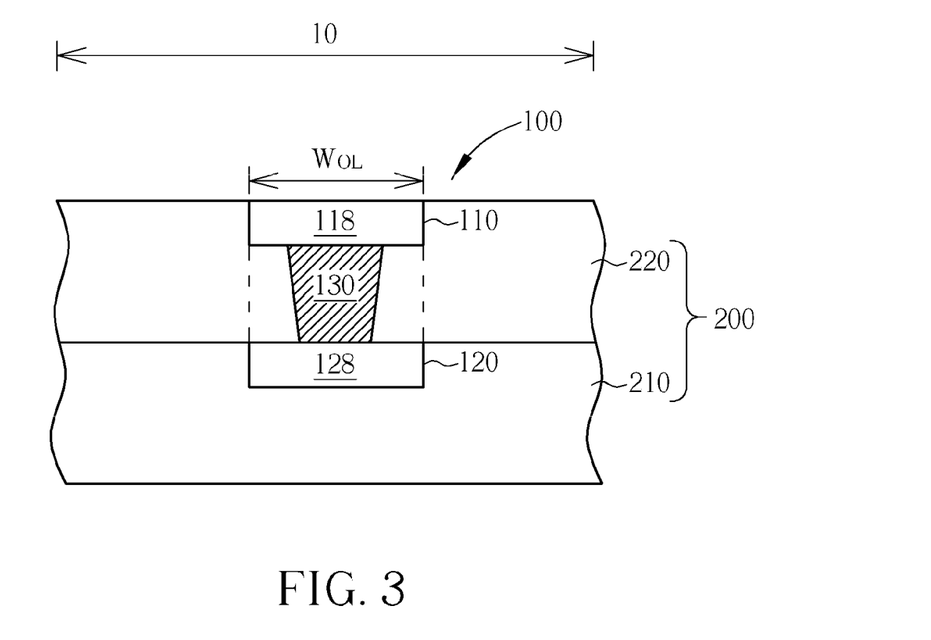
FIG. 3 is a cross-sectional view taken along line A-A' of FIG. 2.
Figure 4:
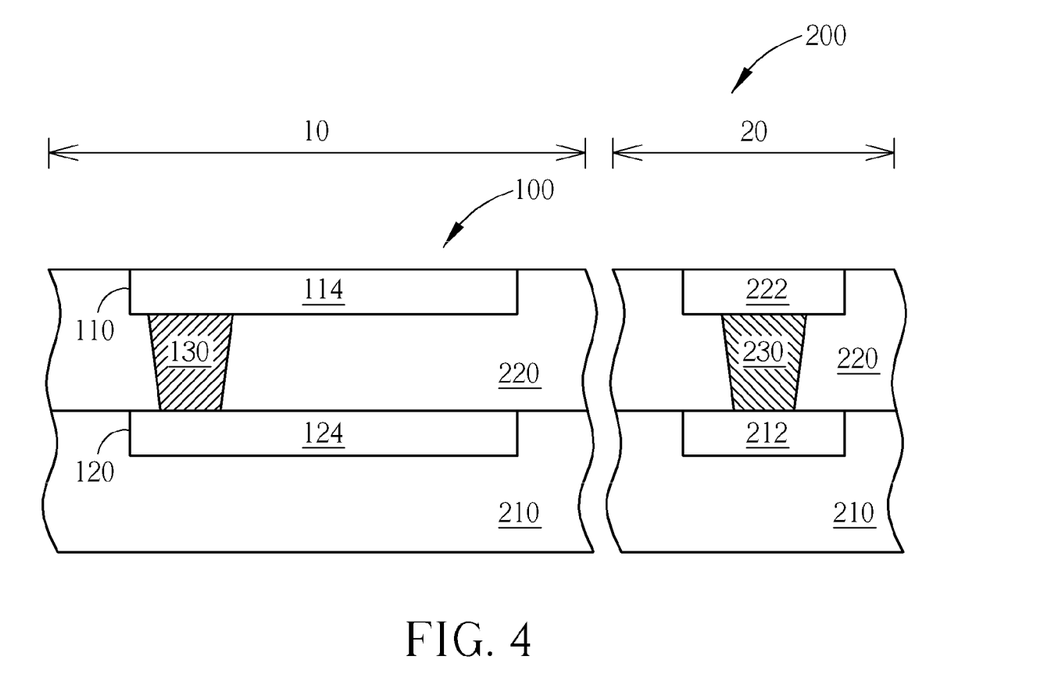
FIG. 4 is a cross-sectional view taken along line B-B' of FIG. 2.
Figure 5:
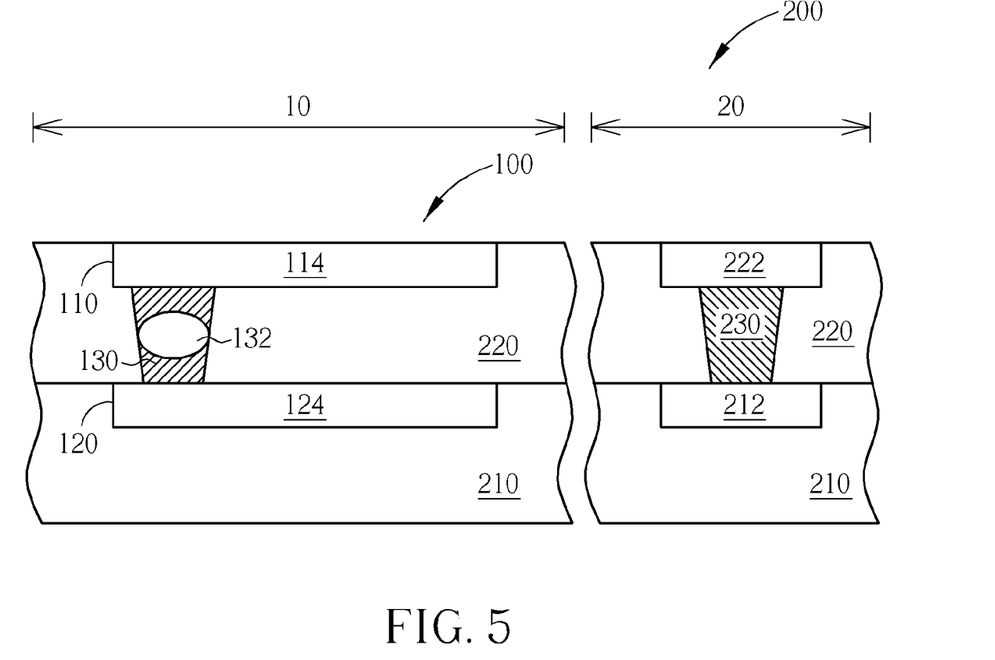
FIG. 5 is another cross-sectional view taken along line B-B' of FIG. 2.
Figure 6:
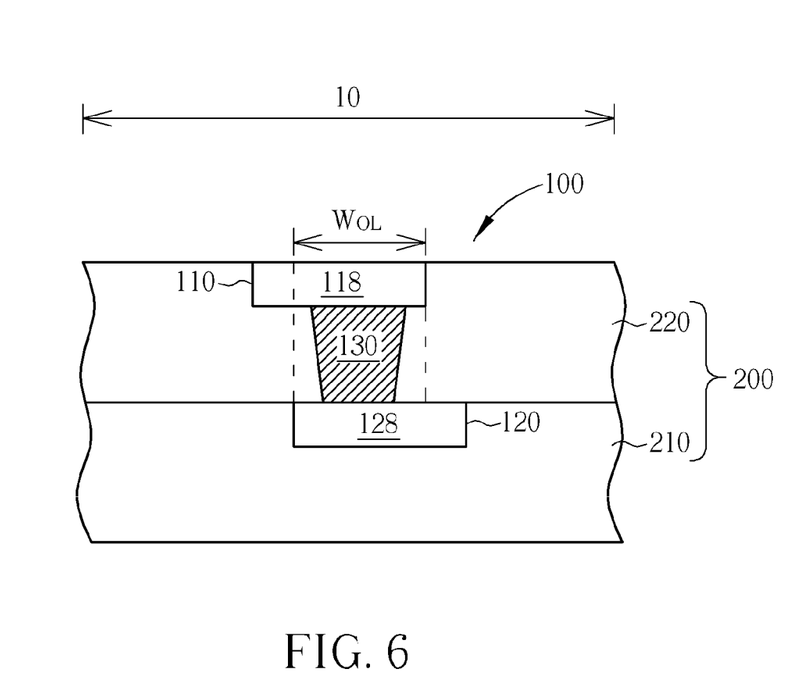
FIG. 6 is a cross-sectional view of a modification take along line A-A' of FIG. 2.

Please refer to FIGS. 2-6, wherein FIG. 2 is a schematic drawing illustrating an e-fuse structure provided by a first preferred embodiment of the present invention, FIG. 3 is a cross-sectional view taken along line A-A' of FIG. 2, FIGS. 4-5 are cross-sectional views taken along line B-B' of FIG. 2, and FIG. 6 is a cross-sectional view of a modification take along line A-A' of FIG. 2. The e-fuse structure 100 provided by the preferred embodiment is positioned on a substrate, and preferably is positioned in a metal interconnection structure. As shown in FIGS. 2-4, the e-fuse structure 100 includes a top conductive pattern 110 and a bottom conductive pattern 120. The top conductive pattern 110 includes a top fuse 112, a top fuse extension portion 114, and a cathode 116. The bottom conductive pattern 120 includes a bottom fuse 122, a bottom fuse extension portion 124, and an anode 126. As mentioned above, the cathode 116 is electrically connected to a blowing device (not shown), and a voltage Vfs is applied to the anode 126. The top fuse 112 is electrically connected to the top fuse extension portion 114 and the cathode 116 while the bottom fuse 122 is electrically connected to the bottom fuse extension portion 124 and the anode 126. According to the preferred embodiment, a length of the top fuse 112 and a length of the bottom fuse 122 are equal, but not limited to this. In addition, the top fuse 112 and the top fuse extension portion 114 have a first included angle C, and the first included angle C is not 180 degrees (°). For example, the first include angle C of the top fuse 112 and the top fuse extension portion 114 is 90° in the preferred embodiment. In the same concept, the bottom fuse 122 and the bottom fuse extension portion 124 have a second included angle D, and the second included angle is not 180°. For example, the second include angle D of the bottom fuse 122 and the bottom fuse extension portion 124 is 90° in the preferred embodiment. In other words, the top fuse extension portion 114 is perpendicular to the top fuse 112, and the bottom fuse extension portion 124 is perpendicular to the bottom fuse 122, but not limited to this. It is noteworthy that the top fuse extension portion 114 is corresponding to the bottom fuse extension portion 124 as show in FIGS. 2-4.

As shown in FIGS. 2-4, the top fuse extension portion 114 includes a top fuse end 118 and the bottom fuse extension portion 124 includes a bottom fuse end 128. More important, the e-fuse structure 100 provided by the preferred embodiment includes a via conductive layer 130 positioned between the top fuse extension portion 114 and the bottom fuse extension portion 124, particularly between the top fuse end 118 and the bottom fuse end 128 for electrically connecting the top fuse extension portion 114 and the bottom fuse extension portion 124.

As mentioned above, the e-fuse structure 100 provided by the preferred embodiment is positioned in a metal interconnection structure 200. For example, the e-fuse structure 100 is positioned in a fuse region 10 of the metal interconnection structure 200. The metal interconnection structure 200 further includes an interconnection region 20 (only shown in FIG. 4) and a plurality of metal interconnections formed in the interconnection region 20. As shown in FIG. 4, the metal interconnection structure 200 includes at least a first dielectric layer 210 and a second dielectric layer 220. The bottom conductive pattern 120 is positioned in the first dielectric layer 210, and the top conductive pattern 110 and the via conductive layer 130 are positioned in the second dielectric layer 220. Furthermore, the metal interconnection structure 200 includes at least a first metal interconnection 212 and a second metal interconnection 222 respectively positioned in the first dielectric layer 210 and the second dielectric layer 220. The second metal interconnection 222 is stacked on the first metal interconnection 212 and, if required, is electrically connected to the first metal interconnection 212 by a via conductive layer 230 positioned in the second dielectric layer 220.

As shown in FIG. 4, the top conductive pattern 110 (including the cathode 116, the top fuse 112, and the top fuse extension portion 114) is formed simultaneously with the second metal interconnection 222 by a same process, and thus the top conductive pattern 110 and the second metal interconnection 222 are coplanar. In the same concept, the bottom conductive pattern 120 (including the anode 126, the bottom fuse 122, and the bottom fuse extension portion 124) is formed simultaneously with the first metal interconnection 212 by a same process, and thus the bottom conductive pattern 120 and the first metal interconnection 212 are coplanar. It should be noted that the first dielectric layer 210, the second dielectric layer 220, the first metal interconnection 212, and the second metal interconnection 222 mentioned in the preferred embodiment are only used to distinguish one element from another element. In other words, the e-fuse structure 100 of the preferred embodiment can be formed simultaneously with any two metal interconnections of the metal interconnection structure 200, thus the top conductive pattern 110 and the bottom conductive pattern 120 are respectively coplanar with an upper metal interconnection and a lower metal interconnection. As shown in FIGS. 2-5, the top conductive pattern 110 positioned in the second dielectric layer 220 not only corresponds to the bottom conductive pattern 120 positioned in the first dielectric layer 210, but the top fuse extension portion 114 also entirely overlaps with the bottom fuse extension portion 124. However, bottom fuse extension portion 124 is not physically contacting with the top fuse extension portion 114 and is electrically isolated from the top fuse extension portion 114 by the second dielectric layer 220. Only the top fuse end 118 of the top fuse extension portion 114 is electrically connected to the bottom fuse end 128 of the bottom fuse extension portion 124 by the via conductive layer 130. A critical dimension (CD) of the via conductive layer 130 can be equal to or smaller than an overlapping width $W_{OL}$ of the top fuse extension portion 114 and the bottom fuse extension portion 124.

Please refer to FIG. 6. Furthermore, though the top fuse extension portion 114 entirely overlaps with the bottom fuse extension portion 124 in the preferred embodiment as shown in FIGS. 2-4, the top fuse extension portion 114 can be formed not entirely overlapped with the bottom fuse extension portion 124 as shown in FIG. 6 as long as the via conductive layer 130 can be formed without any influences. For example, a width of the top fuse extension portion 114 can be equal to or larger than the overlapping width $W_{OL}$ of the top fuse extension portion 114 and the bottom fuse extension portion 124. Also a width of the bottom fuse extension portion 124 can be equal to or larger than the overlapping width $W_{OL}$ of the top fuse extension portion 114 and the bottom fuse extension portion 124. In addition, the non-overlapping portion of the top fuse extension portion 114 or the non-overlapping portion of the bottom fuse extension portion 124 overhangs on any long side of the overlapping region as shown in FIG. 6, even overhangs on two long sides of the overlapping region.

Please refer to FIG. 2 again. A length of the top fuse extension portion 114 and a length of the bottom fuse extension portion 124 are preferably larger than a half of a width W of the e-fuse structure 100, but not limited to this. It is well-known that a blown region of an e-fuse varies according to the design of the product. Accordingly, the top fuse extension portion 114 perpendicular to the top fuse 112 and the bottom fuse extension portion 124 perpendicular to the bottom fuse 122 are respectively extended from the top fuse 112 and the bottom fuse 122. Consequently, the electro-migration effect is amplified by those extension portions 114/124, and thus the blowing current used to provide open circuit condition to the e-fuse structure 100 in a blowing process is reduced.

Please refer to FIG. 2 and FIG. 5. It is noteworthy that since the top fuse extension portion 114 is extended from the top fuse 112 and the bottom fuse extension portion 124 is extended from the bottom fuse 122, the EM initial void is ensured to first nucleate in the via conductive layer 130 and then grows to be a blowing point 132 in the via conductive layer 130 after a blowing process as shown in FIG. 5. The blowing point 132 electrically isolated the top conductive pattern 110 from the bottom conductive pattern 120 and eventually results in a circuit dead opening. Briefly speaking, the e-fuse structure 100 provided by the preferred embodiment ensures that the blowing point is formed in the via conductive layer 130. Accordingly, when the e-fuse structure 100 serves as programming elements or memory elements, it is more difficult and complicated to find the blowing point 132 formed in the via conductive layer 130 and thus the data security is improved.

Figure 7:
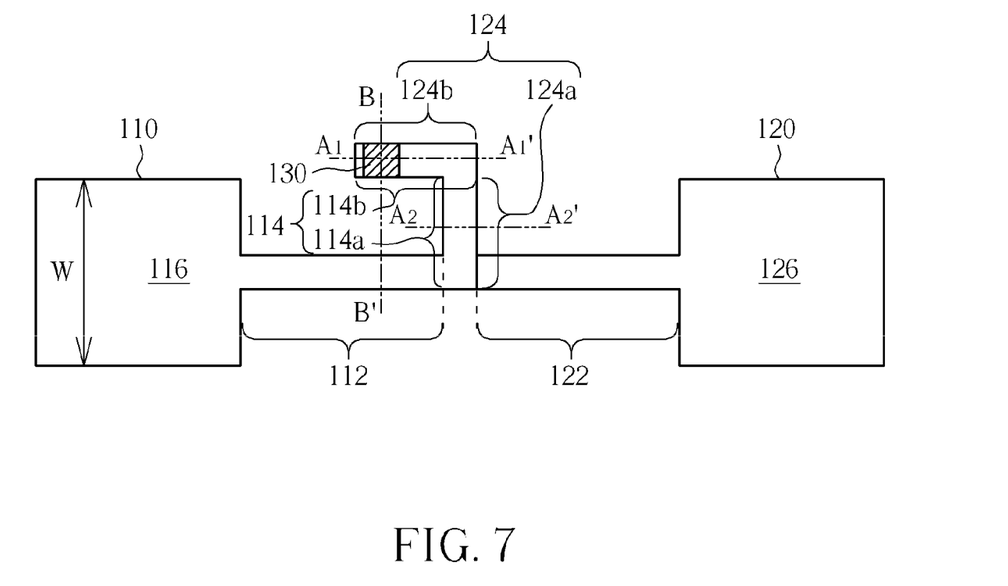
FIG. 7 is a schematic drawing illustrating an e-fuse structure provided by a second preferred embodiment of the present invention.
Figure 8:
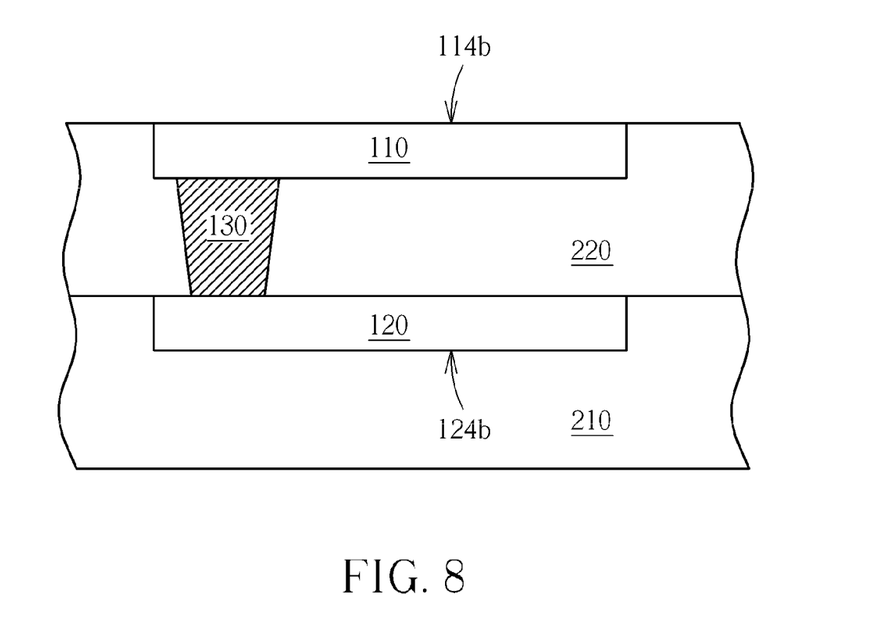
FIG. 8 is a cross-sectional view taken along line $A_1$-$A_1$' of FIG. 7.
Figure 9:
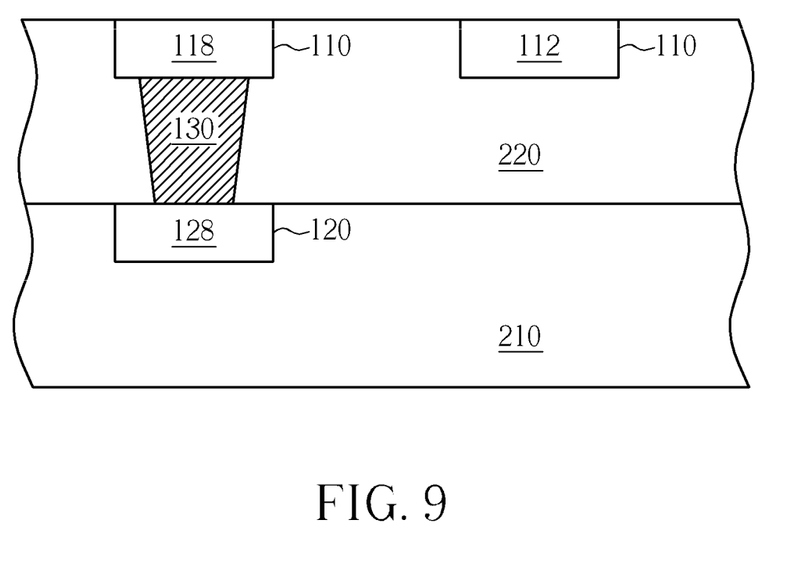
FIG. 9 is a cross-sectional view taken along line B-B' of FIG. 7.
Figure 10:
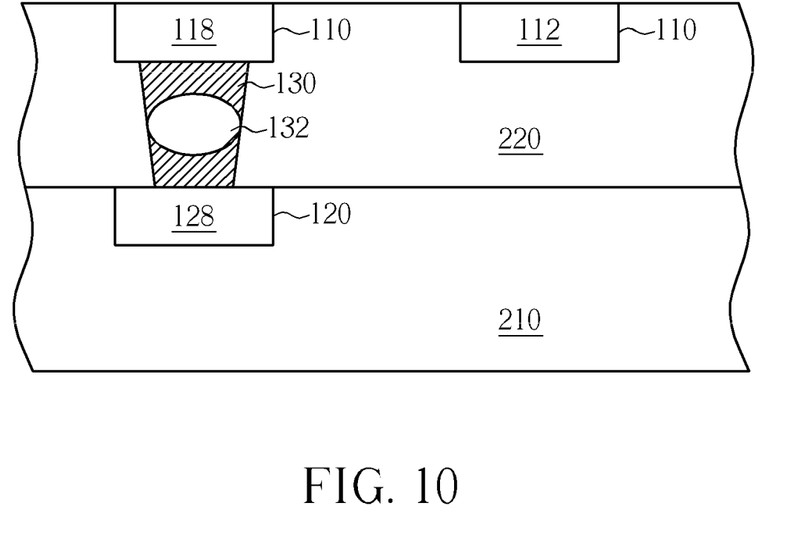
FIG. 10 is another cross-sectional view taken along line B-B' of FIG. 7.
Figure 11:
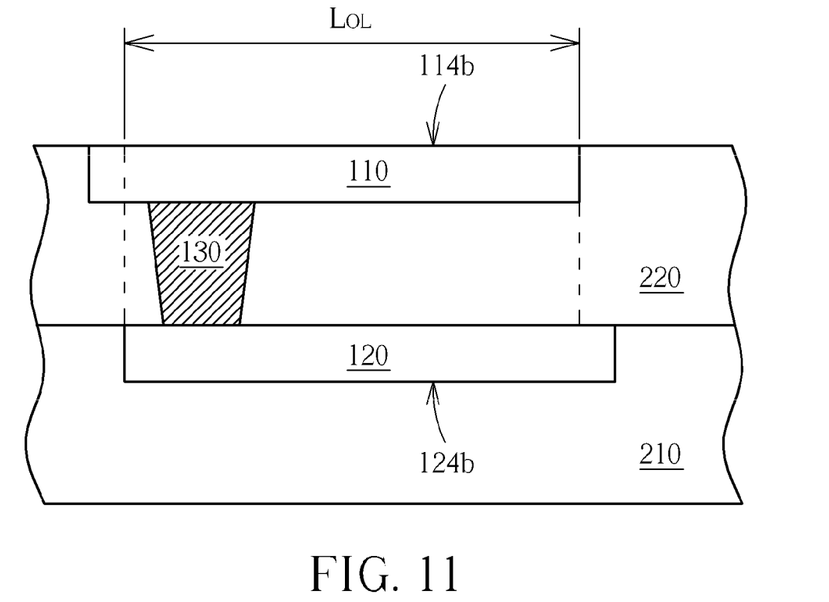
FIG. 11 is a cross-sectional view of a modification taken along line $A_1$-$A_1$ of FIG. 7.
Figure 12:
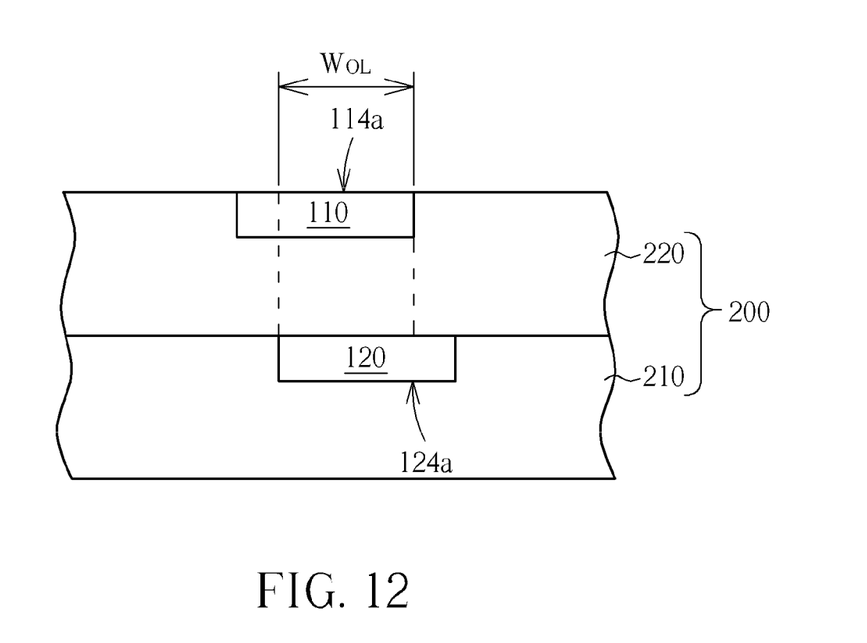
FIG. 12 is a cross-sectional view of a modification take along line $A_2$-$A_2$ of FIG. 7.

Please refer to FIGS. 7-12, wherein FIG. 7 is a schematic drawing illustrating an e-fuse structure provided by a second preferred embodiment of the present invention, FIG. 8 is a cross-sectional view taken along line A-A' of FIG. 7, FIGS. 9-10 are cross-sectional views taken along line B-B' of FIG. 7, FIG. 11 is a cross-sectional view of a modification taken along line A₁-A₁' of FIG. 7, and FIG. 12 is a cross-sectional view of a modification take along line A2-A2' of FIG. 7. It is noteworthy that elements the same in both of the first and second preferred embodiment are designated by the same numerals, and thus details about those elements are omitted in the interest of brevity. Furthermore, the relationship between the e-fuse structure and the metal interconnection structure provided by the second preferred embodiment is the same with that described in the first preferred embodiment, therefore those details are also omitted for simplicity. An e-fuse structure 100 provided by the preferred embodiment is positioned in a metal interconnection structure on a substrate. As show in FIGS. 7-12, the e-fuse structure 100 includes a top conductive pattern 110 and a bottom conductive pattern 120. The top conductive pattern 110 includes a top fuse 112, a top fuse extension portion 114 and a cathode 116. The bottom conductive pattern 120 also includes a bottom fuse 122, a bottom fuse extension portion 124, and an anode 126. As mentioned above, the cathode 116 is electrically connected to a blowing device (not shown), and a voltage Vfs is applied to the anode 126. The top fuse 112 is electrically connected to the top fuse extension portion 114 and the cathode 116 while the bottom fuse 122 is electrically connected to the bottom fuse extension portion 124 and the anode 126. According to the preferred embodiment, a length of the top fuse 112 and a length of the bottom fuse 122 are equal, but not limited to this.

It is noteworthy that according to the preferred embodiment, the top fuse extension portion 114 includes a first part 114a and a third part 114b. As shown in FIG. 7, the first part 114a of the top fuse extension portion 114 is perpendicular to the top fuse 112, and the third part 114b is perpendicular to the first part 114a and electrically connected to the first part 114a. In other words, the first part 114a of the top fuse extension portion 114 is perpendicular to both the top fuse 112 and the third part 114b, which are parallel with each other. Furthermore, the third part 114b of the top fuse extension portion 114 includes a top fuse end 118. The bottom fuse extension portion 124 is corresponding to the top fuse extension portion 114 as shown in FIGS. 7-9. Accordingly, the bottom fuse extension portion 124 includes a second part 124a and a fourth part 124b. As shown in FIG. 7, the second part 124a of the bottom fuse extension portion 124 is perpendicular to the bottom fuse 122, and the fourth part 124b is perpendicular to the second part 124a and electrically connected to the second part 124a. In other words, the second part 124a of the bottom fuse extension portion 124 is perpendicular to both the bottom fuse 122 and the fourth part 124b, which are parallel with each other. Furthermore, the fourth part 124b of the bottom fuse extension portion 124 includes a bottom fuse end 128. More important, the e-fuse structure 100 of the preferred embodiment includes a via conductive layer 130 positioned between the top fuse extension portion 114 and the bottom fuse extension portion 124, and more particularly, between the top fuse end 118 and the bottom fuse end 128 for electrically connecting the top fuse extension portion 114 to the bottom fuse extension portion 124.

As mentioned above, the e-fuse structure 100 of the preferred embodiment can be formed simultaneously with any two metal interconnections of the metal interconnection structure 200, thus the top conductive pattern 110 and the bottom conductive pattern 120 are respectively coplanar with an upper metal interconnection and a lower metal interconnection. As shown in FIGS. 7-10, the top conductive pattern 110 positioned in the second dielectric layer 220 not only corresponds to the bottom conductive pattern 120 positioned in the first dielectric layer 210, but the top fuse extension portion 114 also entirely overlaps with the bottom fuse extension portion 124. However, the bottom fuse extension portion 124 is not physically contacting with the top fuse extension portion 114 and is electrically isolated from the top fuse extension portion 114 by the second dielectric layer 220. Only the top fuse end 118 of the top fuse extension portion 114 is electrically connected to the bottom fuse end 128 of the bottom fuse extension portion 124 by the via conductive layer 130. As mentioned above, a critical dimension of the via conductive layer 130 can be equal to or smaller than an overlapping width $W_{OL}$ of the top fuse extension portion 114 and the bottom fuse extension portion 124. The first part 114a, the third part 114b, the top fuse 112, and the cathode 116 are all coplanar. The second part 124a, the fourth part 124b, the bottom fuse 122, and the anode 126 are all coplanar.

Please refer to FIGS. 11-12. Furthermore, though the top fuse extension portion 114 entirely overlaps with the bottom fuse extension portion 124 in the preferred embodiment as shown in FIGS. 7-10, the top fuse extension portion 114 can be formed not entirely overlapped with the bottom fuse extension portion 124 as shown in FIGS. 11-12 as long as the via conductive layer 130 can be formed without any influences. As shown in FIG. 11, a length of the third part 114b of the top fuse extension portion 114 can be exemplarily equal to or larger than an overlapping length $L_{OL}$ of the top fuse extension portion 114 and the bottom fuse extension portion 124. Also, a length of the fourth part 124b of the bottom fuse extension portion 124 can be exemplarily equal to or larger than the overlapping length $L_{OL}$ of the top fuse extension portion 114 and the bottom fuse extension portion 124. As shown in FIG. 12, a width of the first part 114a of the top fuse extension portion 114 can be exemplarily equal to or larger than the overlapping width $W_{OL}$ of the top fuse extension portion 114 and the bottom fuse extension portion 124. Also a width of the second part 124a of the bottom fuse extension portion 124 can be equal to or larger than the overlapping width $W_{OL}$ of the top fuse extension portion 114 and the bottom fuse extension portion 124. In addition, the non-overlapping portion of the top fuse extension portion 114 or the non-overlapping portion of the bottom fuse extension portion 124 overhangs on any long side of the overlapping region as shown in FIG. 12, even overhangs on two long sides of the overlapping region.

Please refer to FIG. 7 again. A length of the first part 114a of the top fuse extension portion 114 and a length of the second part 124a of the bottom fuse extension portion 124 are preferably larger than a half of a width W of the e-fuse structure 100, but not limited to this. It is noteworthy that although an extension direction of the third part 114b and an extension direction of the fourth part 124b are both positioned toward the cathode 116, and thus the top fuse end 118 and the bottom fuse end 128 are near the cathode 116 according to the preferred embodiment, the extension directions of the third part 114b and the fourth part 124b still can be positioned toward the anode 126 and thus the top fuse end 118 and the bottom fuse end 128 are near the anode 126 if required. It is well-known that a blown region of an e-fuse varies according to the design of the product. Accordingly, the top fuse extension portion 114 having the first part 114a and the third part 114b are extended from the top fuse 112, and the bottom fuse extension portion 124 having the second part 124a and the fourth part 124b are extended from the bottom fuse 122. Consequently, the electro-migration effect is amplified by those extension portions 114/124 and thus the blowing current used to provide open circuit condition to the e-fuse structure 100 in a blowing process is reduced. For Example, a blowing window of the e-fuse structure 100 provided by the preferred embodiment is between 17 mA and 30 mA. In other words, the e-fuse structure 100 provided by the preferred embodiment benefits a larger blowing window.

Please refer to FIGS. 7-10. It is noteworthy that since the top fuse extension portion 114 is extended from the top fuse 112 and the bottom fuse extension portion 124 is extended from the bottom fuse 122, the EM initial void is ensured to first nucleate in the via conductive layer 130 and then grows to be a blowing point 132 in the via conductive layer 130 after a blowing process as shown in FIG. 10. The blowing point 132 electrically isolated the top conductive pattern 110 from the bottom conductive pattern 120 and eventually results in a circuit dead opening. Briefly speaking, the e-fuse structure 100 provided by the preferred embodiment ensures the blowing point 132 is formed in the via conductive layer 130. Accordingly, when the e-fuse structure 100 serves as programming elements or memory elements, it is more difficult and complicated to find the blowing point 132 formed in the via conductive layer 130 and thus the data security is improved.

According to the e-fuse structure provided by the present invention, the top fuse extension portion and the bottom fuse extension portion are respectively extended from the top fuse and the bottom fuse. Consequently, the electro-migration effect is amplified by those extension portions and thus the blowing current used to provide open circuit condition to the e-fuse is reduced. In other words, the e-fuse structure provided by the present invention obtains a larger blowing window due to the top fuse extension portion and the bottom fuse extension portion. Furthermore, because the blowing window is enlarged, the e-fuse structure provided by the present invention can be further shrunk. Moreover, because the e-fuse structure provided by the present invention ensures the blowing point is formed in the via conductive layer, when the e-fuse structure serves as programming elements or memory elements, it is more difficult and complicated to find the blowing point formed in the via conductive layer and thus the data security is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical fuse (e-fuse) structure comprising:
   a top conductive pattern having a top fuse and a top fuse extension portion, the top fuse extension portion being extended from the top fuse and physically contacting the top fuse;
   a bottom conductive pattern having a bottom fuse and a bottom fuse extension portion, the bottom fuse extension portion being entirely overlapped by the top fuse extension portion, wherein the top fuse and the bottom fuse are not overlapped and are arranged to form a straight line in a top view; and
   a via conductive layer positioned between the top fuse extension portion and the bottom fuse extension portion for electrically connecting the top fuse extension portion and the bottom fuse extension portion, wherein the via conductive layer is not formed on the straight line.

2. The e-fuse structure according to claim 1, wherein the top conductive pattern and the bottom conductive pattern respectively comprise a cathode and an anode.

3. The e-fuse structure according to claim 2, wherein the top fuse is electrically connected to the top fuse extension portion and the cathode, and the bottom fuse is electrically connected to the bottom fuse extension portion and the anode.

4. The e-fuse structure according to claim 1, wherein the top fuse and the top fuse extension portion are coplanar, and the bottom fuse and the bottom fuse extension portion are coplanar.

5. The e-fuse structure according to claim 4, further comprising a first dielectric layer and a second dielectric layer, the bottom conductive pattern is positioned in the first dielectric layer, and the top conductive pattern and the via conductive layer are positioned in the second dielectric layer.

6. The e-fuse structure according to claim 5, further comprising a first metal interconnection and a second metal interconnection stacked on the first metal interconnection, the first metal interconnection and the second metal interconnection are respectively positioned in the first dielectric layer and the second dielectric layer.

7. The e-fuse structure according to claim 6, wherein the first metal interconnection and the bottom conductive pattern are coplanar, and the second metal interconnection and the top conductive pattern are coplanar.

8. The e-fuse structure according to claim 1, wherein the bottom fuse extension portion is corresponding to the top fuse extension portion but not physically contacting to the top fuse extension portion.

9. The e-fuse structure according to claim 1, wherein the top fuse and the top fuse extension portion have a first included angle, the first included angle is not 180 degrees (°), and the bottom fuse and the bottom fuse extension portion have a second included angle and the second included angle is not 180°.

10. The e-fuse structure according to claim 1, wherein the top fuse extension portion comprises a top fuse end, and the bottom fuse extension portion comprises a bottom fuse end.

11. The e-fuse structure according to claim 10, wherein the top fuse end is electrically connected to the via conductive layer, and the bottom fuse end is electrically connected to the via conductive layer.

12. The e-fuse structure according to claim 10, wherein the top fuse extension portion comprises at least a first part being perpendicular to the top fuse, and the bottom fuse extension portion comprises at least a second part being perpendicular to the bottom fuse.

13. The e-fuse structure according to claim 12, wherein the first part comprises the top fuse end, and the second part comprises the bottom fuse end.

14. The e-fuse structure according to claim 12, wherein the top fuse extension portion further comprises a third part electrically connected to the first part, and the bottom fuse extension portion further comprises a fourth part electrically connected to the second part.

15. The e-fuse structure according to claim 14, wherein the third part is perpendicular to the first part, and the fourth part is perpendicular to the second part.

16. The e-fuse structure according to claim 15, wherein the third part and the first part are coplanar, and the fourth part and the second part are coplanar.

17. The e-fuse structure according to claim 14, wherein the third part comprises the top fuse end, and the fourth part comprises the bottom fuse end.

18. The e-fuse structure according to claim 14, wherein the first part and the second part are corresponding to each other but not physically contacting to each other, and the third part and the fourth part are corresponding to each other but not physically contacting to each other.

19. The e-fuse structure according to claim 18, wherein at least a portion of the first part overlaps with a portion of the second part, and at least a portion of the third overlaps with a portion of the further part.

20. The e-fuse structure according to claim 1, further comprising a blowing point formed in the via conductive layer after a blowing process.

21. The e-fuse structure according to claim 20, wherein the blowing point electrically isolated the top conductive pattern from the bottom conductive pattern.

* * * * *